(12) United States Patent
Riley et al.

(10) Patent No.: US 6,738,731 B1
(45) Date of Patent: May 18, 2004

(54) METHOD AND APPARATUS FOR USING TOOL STATE INFORMATION TO IDENTIFY FAULTY WAFERS

(75) Inventors: Terrence J. Riley, Austin, TX (US); Qingsu Wang, Austin, TX (US); Glen W. Scheid, Gresham, OR (US); Kent F. Knox, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 359 days.

(21) Appl. No.: 09/815,445

(22) Filed: Mar. 22, 2001

(51) Int. Cl.[7] ................................ G01R 31/26
(52) U.S. Cl. .................. 702/185; 700/110; 700/175; 324/765
(58) Field of Search ................. 702/185; 700/108, 700/110, 175, 121, 213–215; 438/14; 324/765

(56) References Cited

U.S. PATENT DOCUMENTS 6,374,150 B2 * 4/2002 Redinbo et al. ............ 700/121
6,442,445 B1 * 8/2002 Bunkofske et al. ......... 700/108
6,465,263 B1 * 10/2002 Coss, Jr. et al. ............. 438/14
6,535,783 B1 * 3/2003 Miller et al. ................ 700/121

* cited by examiner

Primary Examiner—Marc S. Hoff
Assistant Examiner—Paul L Kim
(74) Attorney, Agent, or Firm—Williams, Morgan & Amerson, P.C.

(57) ABSTRACT

A method for identifying faulty wafers includes processing a set of wafers in a tool; collecting tool state information during the processing of the set of wafers; generating a tool state information baseline; comparing the tool state information for each wafer to the tool state information baseline to identify any wafers with outlying tool state information; and designating a particular wafer in the set as suspect in response to identifying outlying tool state information for the particular wafer. A processing line includes a tool adapted to process a set of wafers, and a process controller. The process controller is adapted to collect tool state information during the processing of the set of wafers, generate a tool state information baseline, compare the tool state information for each wafer to the baseline tool state information to identify any wafers with outlying tool state information, and designate a particular wafer in the set as suspect in response to identifying outlying tool state information for the particular wafer.

29 Claims, 3 Drawing Sheets

METHOD AND APPARATUS FOR USING TOOL STATE INFORMATION TO IDENTIFY FAULTY WAFERS

BACKGROUND OF THE INVENTION

1. Field of the Invention

This invention relates generally to semiconductor fabrication technology and, more particularly, to a method and apparatus for using tool state information to identify faulty wafers.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

The technologies underlying semiconductor processing tools have attracted increased attention over the last several years, resulting in substantial refinements. However, despite the advances made in this area, many of the processing tools that are currently commercially available suffer certain deficiencies. In particular, such tools often lack advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These deficiencies can engender nonoptimal control of critical processing parameters, such as throughput, accuracy, stability and repeatability, processing temperatures, mechanical tool parameters, and the like. This variability manifests itself as within-run disparities, run-to-run disparities and tool-to-tool disparities that can propagate into deviations in product quality and performance, whereas an ideal monitoring and diagnostics system for such tools would provide a means of monitoring this variability, as well as providing means for optimizing control of critical parameters.

Occasionally, during the fabrication process, one or more process steps are omitted on a production wafer. Such omissions may be due to an error in the fabrication facility automated work flow system (e.g., a database or control script error), a tool failure, or an operator error. If the omitted process steps occur early during the fabrication process, it is not uncommon for the faulty wafer to undergo many subsequent steps prior to the faulty fabrication being identified. Often such identification occurs much further down the processing line, such as during the performance of electrical tests on the devices formed on the wafer. As a result, many resources, such as materials, tool time, operator time, etc., are wasted until the faulty fabrication can be identified.

The present invention is directed to overcoming, or at least reducing the effects of, one or more of the problems set forth above.

SUMMARY OF THE INVENTION

One aspect of the present invention is seen in a method for identifying faulty wafers. The method includes processing a set of wafers in a tool; collecting tool state information during the processing of the set of wafers; generating a tool state information baseline; comparing the tool state information for each wafer to the tool state information baseline to identify any wafers with outlying tool state information; and designating a particular wafer in the set as suspect in response to identifying outlying tool state information for the particular wafer.

Another aspect of the present invention is seen in a processing line including a tool adapted to process a set of wafers, and a process controller. The process controller is adapted to collect tool state information during the processing of the set of wafers, generate a tool state information baseline, compare the tool state information for each wafer to the baseline tool state information to identify any wafers with outlying tool state information, and designate a particular wafer in the set as suspect in response to identifying outlying tool state information for the particular wafer.

BRIEF DESCRIPTION OF THE DRAWINGS

The invention may be understood by reference to the following description taken in conjunction with the accompanying drawings, in which like reference numerals identify like elements, and in which.

Figure 1:
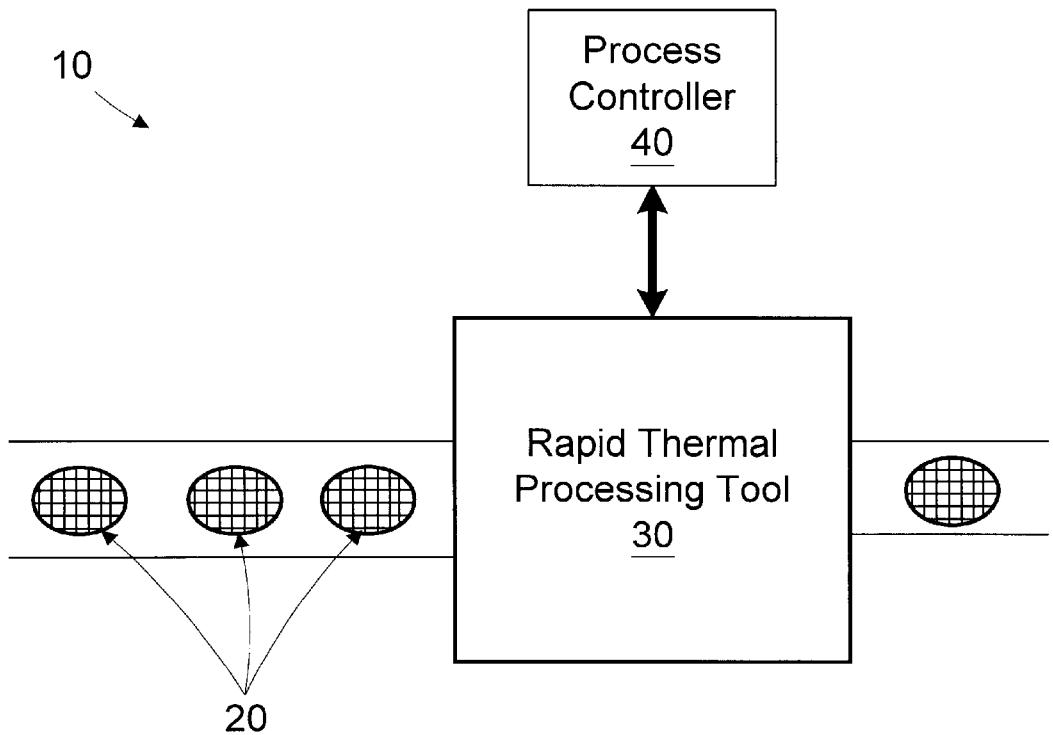
FIG. 1 is a simplified block diagram of a portion of a processing line used to manufacture semiconductor devices in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring now to FIG. 1, a simplified diagram of a portion of an illustrative processing line 10 for processing wafers 20 in accordance with the present invention is provided. The processing line 10 includes a rapid thermal processing (RTP) tool 30 and a process controller 40. The processing line 10 may be one part of an elaborate fabrication process for manufacturing the semiconductor wafers 20 into functional semiconductor devices. The RTP tool 30 may be controlled by the process controller 40. The process controller 40 may send a plurality of control signals and receive various state information on the operation of the RTP tool 30. In the illustrated embodiment, the process controller 40 is adapted to collect tool state information from the RTP tool 30 for each of the wafers processed in a lot and compare the tool state information to identify faulty wafers.

In the illustrated embodiment, the process controller 40 is a computer programmed with software to implement the functions described. However, as will be appreciated by those of ordinary skill in the art, a hardware controller designed to implement the particular functions may also be used. Moreover, the functions performed by the process controller 40, as described herein, may be performed by multiple controller devices distributed throughout a system. Additionally, the process controller 40 may be a stand-alone controller, it may be resident on the RTP tool 30, or it may be part of a system controlling operations in an integrated circuit manufacturing facility. The process controller 40 may communicate with the RTP tool 30 using protocols and interfaces provided by the manufacturer. Alternatively, the process controller 40 may be connected to a larger network of controllers and communicate with the RTP tool 30 through an Advanced Process Control (APC) framework interface. For example, the RTP tool 30 may be coupled to an equipment interface (not shown) that retrieves data from the RTP tool 30 and communicates this data to the Advanced Process Control (APC) framework. The equipment interface may receive control signals from the APC framework that may be used to control the RTP tool 30.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the process controller 40 as described is the Catalyst system offered by KLA-Tencor, Inc. The Catalyst system uses Semiconductor Equipment and Materials International (SEMI) Computer Integrated Manufacturing (CIM) Framework compliant system technologies and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

The semiconductor wafers 20 are generally processed in batches, which are commonly referred to as lots. For example, a lot of wafers 20 may include around twenty-five wafers. The wafers 20 within a lot progress through the manufacturing process together in an attempt to subject the wafers 20 to substantially the same manufacturing conditions, such that the resulting semiconductor devices have substantially the same performance characteristics (e.g., speed, power, etc.) Unlike other processing tools in a semiconductor fabrication facility that simultaneously process all of the wafers 20 in a lot in the same production run, the RTP tool 30 processes the wafers 20 individually.

Generally, rapid thermal processing (RTP) comprises quickly increasing the temperature of at least a portion of the wafer 20 or of a process layer formed thereon for short periods of time. For example, rapid thermal processing is used to thermally anneal the wafer 20 after an ion implantation process. During ion implantation, the surface of the wafer 20 is bombarded with either N or P type dopant atoms, and as a result of the implantation, the crystal lattice of the semiconductor wafer may become damaged. The anneal step utilizes rapid thermal processing to recrystallize the silicon. The wafer 20 may be annealed by quickly ramping up to a desired processing temperature, holding the processing temperature for a desired period of time, and cooling the wafer 20 back to room temperature in a matter of seconds. Although exact temperatures and times may vary depending upon the particular annealing process, the wafer 20 may be heated to approximately 1000° C. for 5 to 30 seconds.

Figure 2:
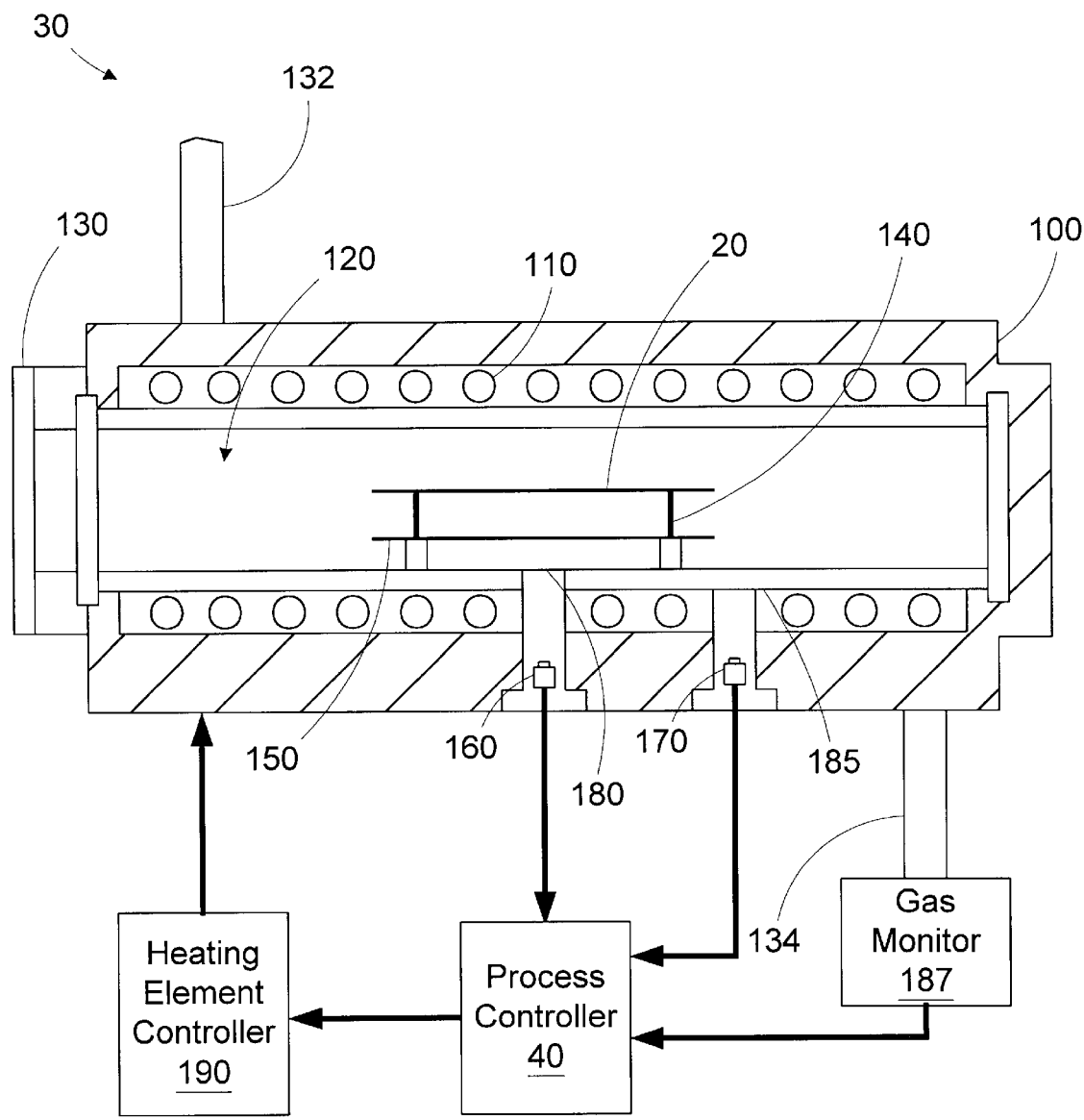
FIG. 2 is a cross-sectional view of a first illustrative rapid thermal processing (RTP) tool of FIG. 1.

Turning now to FIG. 2, a cross-sectional view of an exemplary embodiment of the RTP tool 30 is shown. A commercially available tool similar to the illustrated embodiment is an SHS 2800 manufactured by AST Elektronik. The RTP tool 30 includes a reactor block 100, heating elements 110, a reactor chamber 120, and a reactor chamber door 130. A process gas supply line 132 and an exhaust line 134 are provided for controlling the processing environment of the reactor chamber 120. The heating elements 110 may be positioned adjacent to the reactor block 100 and may be comprised of a variety of devices, such as tungsten halogen lamps. The heating elements 110 provide heat to the reactor chamber 120. Each heating element 110 may be independently and dynamically controlled to provide uniform and precise heating to the wafer 20 using radiation that passes through the reaction chamber 120.

The reactor chamber 120 separates the wafer 20 from the heating elements 110 and the reactor block 100, thus, providing a tightly controlled processing environment while minimizing the amount of contamination to which the wafer 20 is exposed. The reactor chamber 120 may be accessed through the reactor chamber door 130. Each wafer 20 in a lot may be individually loaded into the RTP tool 30 and extracted, after processing, through the reactor chamber door 130. The wafer 20 is positioned on quartz pins 140 attached to a quartz wafer tray (not shown), which resides inside the reactor chamber 120. A permanent wafer 150 may be positioned beneath the wafer 20. The permanent wafer 150 may be a HotLiner™, which is a silicon nitride coated silicon wafer. The permanent wafer 150 helps ensure that the temperature of the wafer 20 is measured accurately.

A variety of parameters (e.g., various tool state data) of the RTP tool 30 may be monitored to determine the current state of the RTP tool 30. Moreover, a variety of sensors and devices may be used to extract the data, and this data may be sent to the process controller 40. In one illustrative embodiment, first and second pyrometers 160, 170 are positioned within or near the reactor block 100. The first pyrometer 160 measures the temperature of the wafer 20 or the permanent wafer 150, and the second pyrometer 170 measures the temperature of the reactor chamber 120. Those skilled in the art will appreciate that the pyrometers 160, 170 are non-intrusive measuring devices that do not contact the wafer 20 or the reactor chamber 120. Rather, the pyrometers 160, 170 are optical instruments that measure temperature by light input. Once calibrated, the pyrometers 160, 170 deliver an electrical signal that correlates light intensity with the temperature of the object the pyrometers 160, 170 view.

The first pyrometer 160 measures the temperature of the wafer 20 through a window 180. The window 180 permits the first pyrometer 160 to "look" into the reactor chamber 120 and determine the temperature of the wafer 20 based on the temperature of the permanent wafer 150. If the permanent wafer 150 were not used, the first pyrometer 160 may give false temperature measurements, because the characteristics of the back side film layer of the wafer 20 may vary. The various film layers each give off different emissions in response to temperature. Because the coating of the permanent wafer 150 remains the same, the first pyrometer 160 may be calibrated based on its emitted radiation. The second pyrometer 170 operates in substantially the same manner as the first pyrometer 160, but operates to measure the temperature of the reactor chamber 120. The second pyrometer 170 is directed at the outer surface 185 of the reactor chamber 120.

Although only two pyrometers 160, 170 are shown, those skilled in the art will appreciate that a plurality of pyrometers 160, 170 may be used to determine the temperature of the wafer 20 and reactor chamber 120. Moreover, rather than using the pyrometers 160, 170, a different measuring device, such as a thermocouple, may be used. The number and particular type of measuring devices may vary, depending upon the application.

In the illustrated embodiment, a heating element controller 190 drives the heating elements 110 during operation of the RTP tool 30. Generally, for a particular process, a specific operating temperature may be desired. The process controller 40 may receive temperature measurements (e.g., tool state data) from the first and second pyrometers 160, 170. Based on the tool state data, the process controller 40 may direct the heating element controller 190 to increase or decrease the power supplied to the heating elements 110. For example, if the temperature inside the reactor chamber 120 needs to be increased, more power may be supplied to the heating elements 110. Likewise, if the temperature inside the reactor chamber 120 needs to be decreased, the power supplied to heating elements 110 may be reduced.

In one embodiment, the power consumption of the heating elements 110 may be monitored by the process controller 40 and included in the tool state data of the RTP tool 30. For example, when power is supplied to the heating elements 110 (e.g., during pre-heat, normal operation, etc.), the process controller 40 may determine whether the RTP tool 30 is operating at 50%, 75%, or any other percentage of full power. Alternatively, the process controller 40 may monitor power consumption of the RTP tool 30 in terms of Watts. In one embodiment, during operation of the RTP tool 30, the power consumption of heating elements 110 may be sent to a data output device (not shown), such as a display, a data file, or the like.

In addition to power consumption, the tool state data may include incremental changes, such as increases or decreases in the power supplied to the heating elements 110. As described above, to maintain a desired operating temperature, the process controller 40 may direct the heating element controller 190 to increase or decrease the power supplied to the heating elements 110. These incremental changes may be monitored by the process controller 40 and included in the tool state data of the RTP tool 30.

A gas monitor 187 may be provided for monitoring the composition and/or pressure of the process gas being exhausted from the reactor chamber 120 in the exhaust line 134 as it exits the RTP tool 30. For example, the oxygen concentration level of the process gas may be monitored using optical emission spectroscopy. Once measured, the exhaust gas data may be received by the process controller 40 and included in the tool state data of the RTP tool 30.

Typically, the tool state data described above is collected for use in controlling and/or qualifying the RTP tool 30. One such application of tool state data is illustrated in U.S. patent application, Ser. No. 09/479,403, entitled "WAFER-LESS QUALIFICATION OF A PROCESSING TOOL", filed in the names of Terrence J. Riley, Qingsu Wang, Michael R. Conboy, Michael L. Miller, and William Jarrett Campbell, and incorporated herein by reference in its entirety. Hence, the data is already available to facilitate the further analysis performed by the process controller 40 for identifying faulty wafers 20, as described in greater detail below.

During the processing runs of the RTP tool 30 for a particular lot, the process controller 40 stores the tool state data. Because all of the wafers 20 in a particular lot are presumably subjected to the same processing environment, and the same RTP recipe is used by the RTP tool 30 for each of the wafers 20, the tool state data for each of the runs should be similar. If the tool state data for a particular wafer is different than the baseline for the other wafers in the lot (i.e., referred to as an outlying wafer), one of two possibilities may exist. First, there may have been an error or failure with the RTP tool 20. Alternatively, the wafer 20 having the different tool state data may be physically different from the other wafers 20 in the lot. A tool failure is generally apparent because it does not correct itself, and all wafers 20 processed after the error are usually affected. However, if the outlying wafer 20 was processed somewhere in the middle of the lot and the subsequently processed wafers match the baseline, it is likely that the outlying wafer is defective. One or more processing steps may have been omitted or extra steps may have been added during the fabrication of the outlying wafer. It is possible that more than one wafer 20 may stray from the baseline. These additional wafer(s) 20 may also be defective. Typically, the higher the number of outlying wafers, the more likely it is that a tool error caused the difference in the tool state data.

There are a number of statistical ways in which the outlying wafer 20 may be identified. For example, an average value for the tool state information may be generated at one or more points during the processing run. The individual tool state information data may be compared to the average to determine if a deviation greater than a predetermined amount exists. Another variation includes determining the average of the tool state information for all the wafers 20 but the one being tested and then doing the comparison. This would prevent the tool state information for the wafer 20 being analyzed from skewing the average.

These techniques and other, more complicated, techniques are well known to those of ordinary skill in the art, and accordingly, they are not described in greater detail herein.

Upon identifying an outlying wafer 20, the process controller 40 may take a variety of automatic corrective actions. For example, the process controller 40 may send a message to a centralized process control server (i.e., system responsible for overall process flow) to flag the outlying wafer as being suspect. The process controller 40 may also send an alert message to an operator of the RTP tool 30 identifying the suspect wafer. Subsequent analysis and/or metrology may be performed on the suspect wafer to determine if it is indeed faulty.

Figure 3:
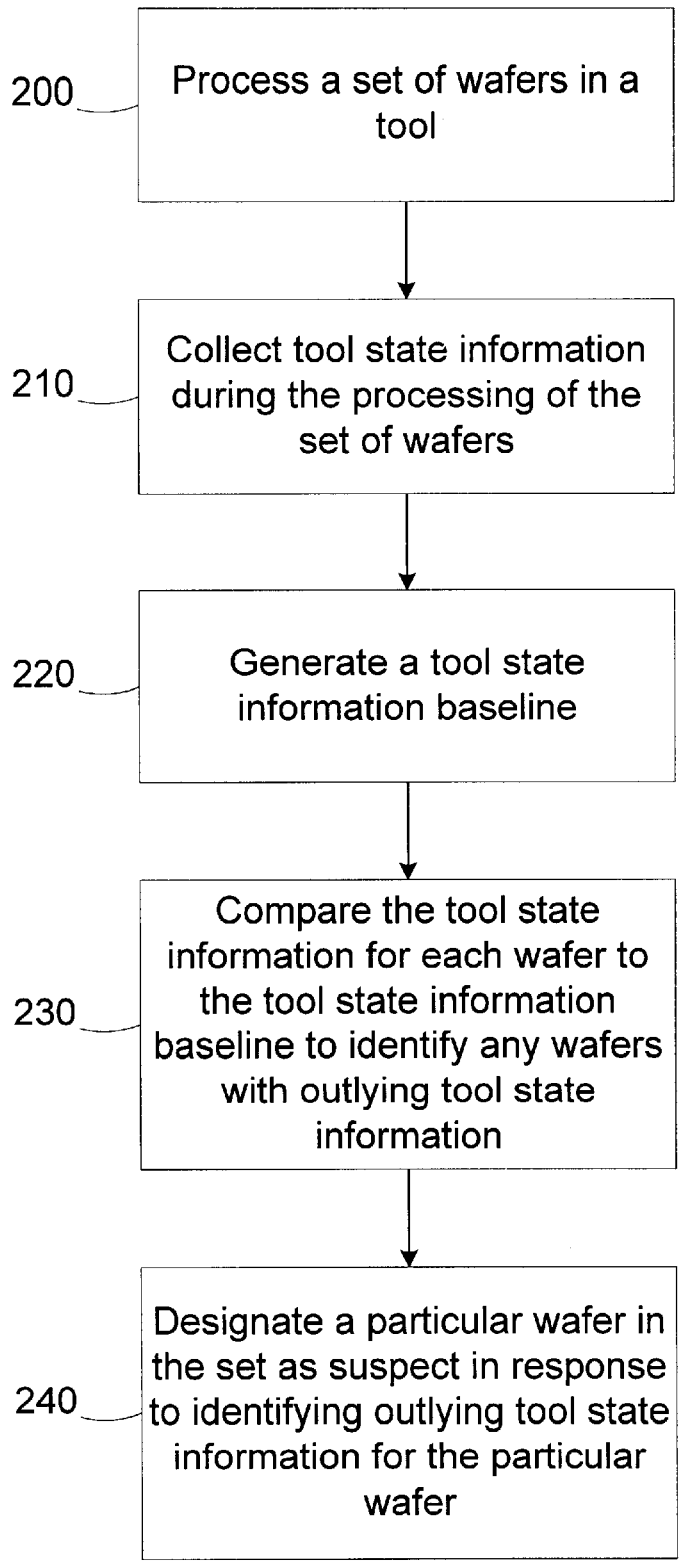
FIG. 3 is a simplified flow diagram of a method for using tool state information to identify faulty wafers in accordance with another illustrative embodiment of the present invention.

Turning now to FIG. 3, a simplified flow diagram of a method using tool state information to identify faulty wafers in accordance with the present invention is provided. In block 200, a set of wafers are processed in a tool, such as the RTP tool 30. In block 210, tool state information is collected during the processing of the set of wafers. For the case of the RTP tool 30, the tool state information may include, but not be limited to, wafer temperature, chamber temperature, lamp power, gas composition, gas pressure, etc. In block 220, a tool state information baseline is constructed. The baseline may be constructed from the tool state information collected for the current set, or alternatively, baseline may be constructed using historical data for similarly processed wafers 20. In block 230, the tool state information for each wafer is compared to the baseline tool state information to identify any wafers with outlying tool state information. In block 240, wafers with outlying tool state information are designated as suspect. The suspect wafers may be further analyzed or scrapped.

Although the invention is described as it may be implemented by monitoring the tool state information for an RTP tool, its application is not so limited. The invention may be applied to other tools for which tool state information maybe collected and analyzed to identify wafers with outlying tool state data. For example, in an etch tool, the tool state information may include endpoint detection time or plasma characteristics. An excessive processing time or outlying plasma characteristics may be indicative of an omitted underlying stop layer, misaligned photomask, etc.

Also, the application of the invention is not limited to a tool that processes one wafer at a time. For example, a tool may process subsets of the wafers in the lot. The tool state information may be used to identify a particular subset with outlying tool state data to permit further analysis of the wafers in the subset.

Identifying faulty wafers using tool state information, as described above, has numerous advantages. First, the detection may be performed using information already collected for unrelated control purposes. The throughput of the processing line is not decreased due to the need for additional metrology. Second, identifying faulty wafers relatively early in the process flow reduces the expenditure of unnecessary resources required to place the wafer in a position for a traditional performance test.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for identifying faulty wafers, comprising:
    processing a set of wafers in a tool;
    collecting tool state information during the processing of the set of wafers;
    generating a tool state information baseline;
    comparing the tool state information for each wafer in the set to the tool state information baseline to identify any wafers with outlying tool state information; and
    designating a particular wafer in the set as suspect in response to identifying outlying tool state information for the particular wafer without a corresponding fault condition for the tool.

2. The method of claim 1, wherein processing the set of wafers in the tool comprises processing the set of wafers in a rapid thermal processing tool.

3. The method of claim 2, wherein collecting the tool state information for each wafer comprises collecting a wafer temperature measurement.

4. The method of claim 2, wherein the rapid thermal processing tool includes a chamber adapted to hold the wafers during processing, and collecting the tool state information for each wafer comprises collecting a chamber temperature measurement.

5. The method of claim 2, wherein the rapid thermal processing tool includes a lamp for heating the wafers during processing, and collecting the tool state information for each wafer comprises collecting a lamp power measurement.

6. The method of claim 2, wherein the rapid thermal processing tool includes a chamber from which process gas is exhausted, and collecting the tool state information for each wafer comprises collecting an exhaust gas composition measurement.

7. The method of claim 1, further comprising initiating an automatic corrective action in response to designating a particular wafer in the set as suspect.

8. The method of claim 7, wherein initiating the automatic corrective action comprises sending an alert message to an operator of the tool.

9. The method of claim 7, wherein initiating the automatic corrective action comprises sending a message identifying the suspect wafer to a centralized process control server.

10. The method of claim 1, wherein processing the set of wafers in the tool comprises processing the set of wafers in an etch tool.

11. The method of claim 10, wherein collecting the tool state information for each wafer comprises collecting at least one of a processing time, an endpoint signal, and a plasma characteristic.

12. The method of claim 1, wherein generating the tool state information baseline generating the tool state information baseline based on the tool state information for the set of wafers.

13. The method of claim 1, wherein generating the tool state information baseline further comprises generating the tool state information baseline based on historical tool state information.

14. A processing line, comprising:
    a tool adapted to process a set of wafers; and
    a process controller adapted to access tool state information collected during the processing of the set of wafers, generate a tool state information baseline, compare the tool state information for each wafer in the set to the baseline tool state information to identify any wafers with outlying tool state information, and designate a particular wafer in the set as suspect in response to identifying outlying tool state information for the particular wafer without a corresponding fault condition for the tool.

15. The processing line of claim 14, wherein the tool comprises a rapid thermal processing tool.

16. The processing line of claim 15, wherein the rapid thermal processing tool includes a temperature monitoring device adapted to send wafer temperature measurements to the process controller as the tool state information.

17. The processing line of claim 15, wherein the rapid thermal processing tool comprises:
a chamber adapted to hold the wafers during processing; and
a temperature monitoring device adapted to measure the temperature of the chamber and send the chamber temperature measurements to the process controller as the tool state information.

18. The processing line of claim 15, wherein the rapid thermal processing tool comprises a lamp for heating the wafers during processing, and the process controller is adapted to collect a lamp power measurement as the tool state information.

19. The processing line of claim 15, wherein the rapid thermal processing tool comprises:
a chamber adapted to hold the wafers during processing, the chamber being adapted to exhaust a process gas; and
an exhaust gas monitor adapted to measure the composition of the exhaust gas and send the measured exhaust gas composition to the process controller as the tool state information.

20. The processing line of claim 14, wherein the process controller is adapted to initiate an automatic corrective action in response to designating a particular wafer in the set as suspect.

21. The processing line of claim 20, wherein the process controller is adapted to send an alert message to an operator of the tool.

22. The processing line of claim 20, wherein the process controller is adapted to send a message identifying the suspect wafer to a centralized process control server.

23. The processing line of claim 14, wherein the tool comprises an etch tool.

24. The processing line of claim 23, wherein the tool state information comprises at least one of a processing time, an endpoint signal, and a plasma characteristic.

25. The processing line of claim 14, wherein the process controller is adapted to generate the tool state information baseline based on the tool state information for the set of wafers.

26. The processing line of claim 14, wherein the process controller is adapted to generate the tool state information baseline based on historical tool state information.

27. A processing line, comprising:
means for processing a set of wafers;
means for collecting tool state information during the processing of the set of wafers;
means for generating a tool state information baseline;
means for comparing the tool state information for each wafer in the set to the tool state information baseline to identify any wafers with outlying state information; and
means for designating a particular wafer in the set as suspect in response to identifying outlying tool state information for the particular wafer without a corresponding fault condition for the tool.

28. A method for identifying faulty wafers, comprising:
collecting tool state information during processing of a set of wafers in a tool;
comparing the tool state information for a selected wafer in the set to the tool state information for other wafers in the set to determine if the selected wafer has outlying tool state information; and
designating the selected wafer as suspect in response to identifying outlying tool state information for the selected wafer.

29. A processing line, comprising:
a tool adapted to process a set of wafers; and
a process controller adapted to access tool state information collected during the processing of the set of wafers, compare the tool state information for a selected wafer in the set to the tool state information for other wafers in the set to determine if the selected wafer has outlying tool state information, and designate the selected wafer as suspect in response to identifying outlying tool state information for the selected wafer.

* * * * *